(12) United States Patent
Tomoda

(10) Patent No.: US 8,628,994 B2
(45) Date of Patent: Jan. 14, 2014

(54) SEMICONDUCTOR LIGHT-EMITTING DEVICE AND METHOD FOR MANUFACTURING THE SAME

(75) Inventor: Katsuhiro Tomoda, Kanagawa (JP)

(73) Assignee: Sony Corporation, Tokyo (JP)

( * ) Notice: Subject to any disclaimer, the term of this patent is extended or adjusted under 35 U.S.C. 154(b) by 30 days.

(21) Appl. No.: 13/491,084

(22) Filed: Jun. 7, 2012

(65) Prior Publication Data

US 2012/0295378 A1 Nov. 22, 2012

Related U.S. Application Data

(62) Division of application No. 12/632,404, filed on Dec. 7, 2009, now Pat. No. 8,222,659.

(30) Foreign Application Priority Data

Dec. 12, 2008 (JP) ................................. 2008-317083

(51) Int. Cl.
*H01L 21/02* (2006.01)

(52) U.S. Cl.
USPC ............... 438/59; 438/62; 438/88; 438/89; 257/E21.273; 257/E33.062; 257/E33.063

(58) Field of Classification Search
USPC ................ 438/59–62, 88–93; 257/E21.273; 257/33.62–68
See application file for complete search history.

(56) References Cited

U.S. PATENT DOCUMENTS

| 7,449,727 | B2 | 11/2008 | Sato et al. |
| 7,999,282 | B2 | 8/2011 | Jeong |
| 8,101,958 | B2 | 1/2012 | Jeong |
| 8,222,659 | B2 * | 7/2012 | Tomoda .................. 257/98 |
| 2005/0168899 | A1 | 8/2005 | Sato et al. |
| 2006/0124954 | A1 | 6/2006 | Akaishi |
| 2010/0102350 | A1 | 4/2010 | Jeong |
| 2010/0109032 | A1 | 5/2010 | Jeong |
| 2011/0260207 | A1 | 10/2011 | Jeong |

FOREIGN PATENT DOCUMENTS

WO 2006/006555 1/2006

OTHER PUBLICATIONS

C. H. Chou et al.; High thermally stable Ni/Ag(Al) alloy contacts on p-GaN; Applied Physics Letters 90, 022103; 2007.

\* cited by examiner

*Primary Examiner* — Michael Lebentritt
(74) *Attorney, Agent, or Firm* — Dentons US LLP

(57) ABSTRACT

A method of making a semiconductor light-emitting device including (A) a light-emitting portion by laminating in sequence a first compound semiconductor layer, an active layer, and a second compound semiconductor layer; (B) a first electrode electrically connected to the first compound semiconductor layer; (C) a transparent conductive material layer on the second compound semiconductor layer; (D) an insulating layer on a transparent conductive material layer; and (E) a second reflective electrode that on the transparent conductive material layer and on the insulating layer in a continuous manner, wherein, that the areas of the active layer, the transparent conductive material layer, the insulating layer, and the second electrode $S_1$, $S_2$, $S_3$, and $S_4$, respectively are related as $S_1 \leq S_2 < S_3$ and $S_2 < S_4$.

5 Claims, 10 Drawing Sheets

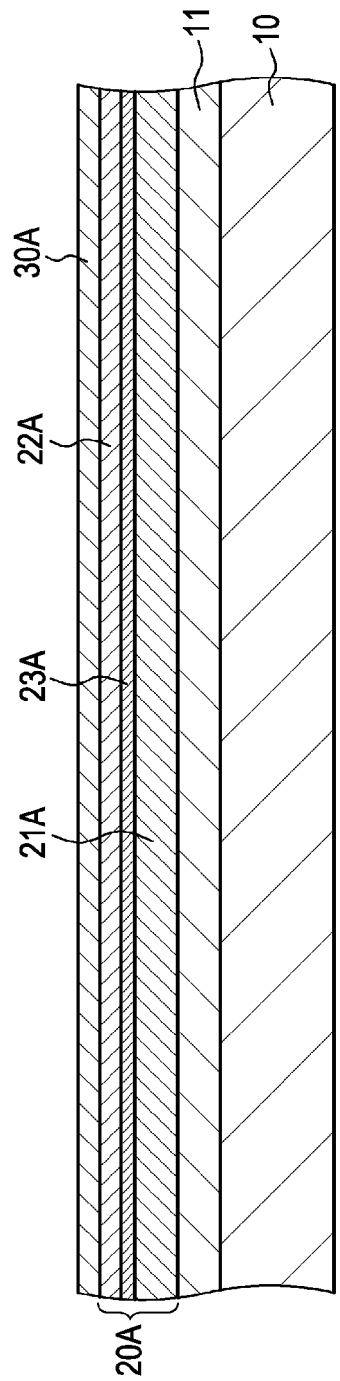
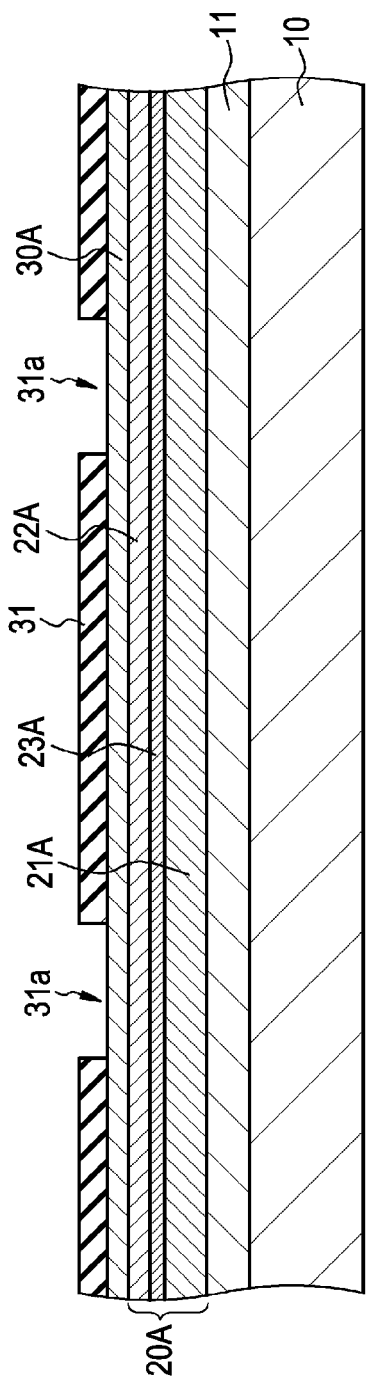

[STEP-130]

[STEP-140]

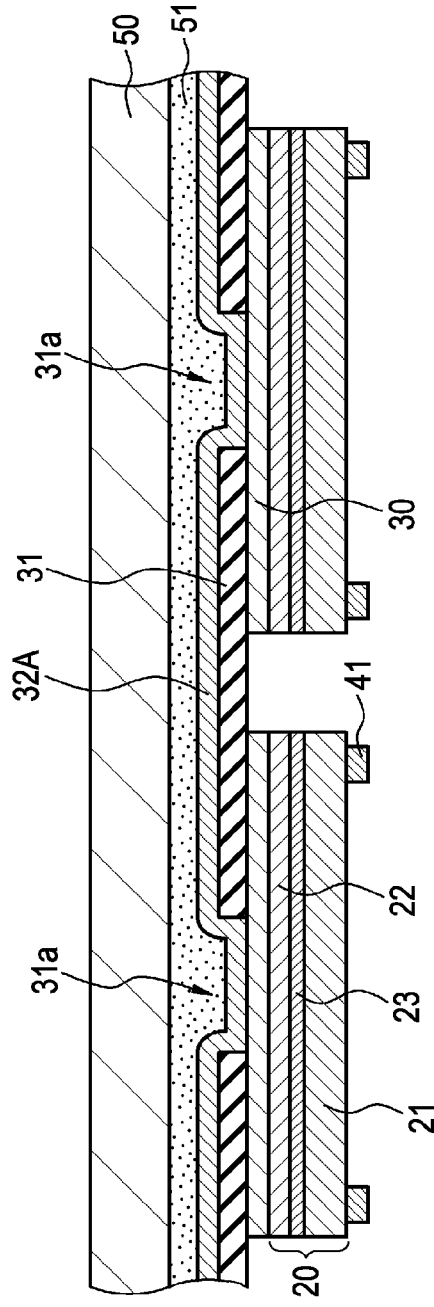
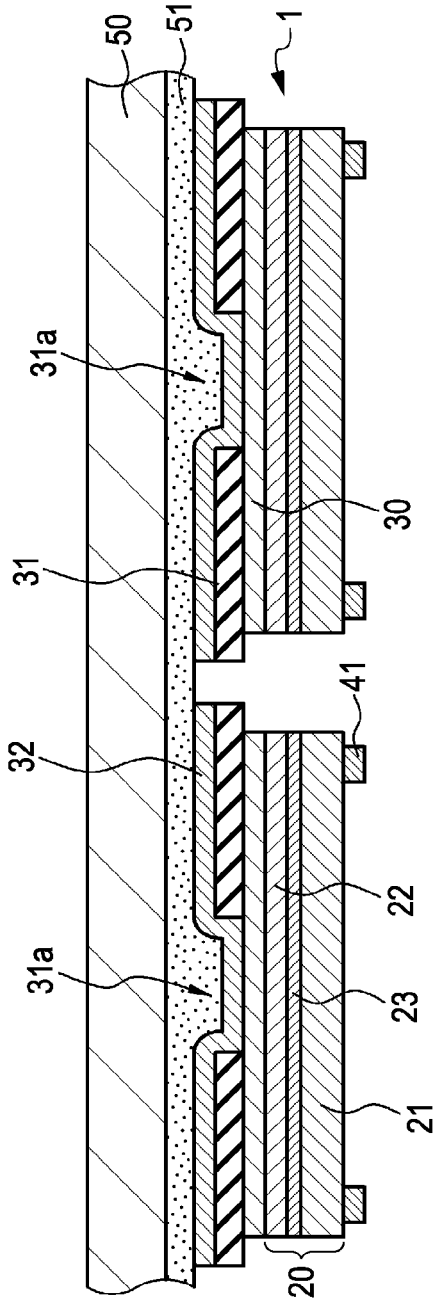

[STEP-200]

[STEP-200] (CONTINUATION)

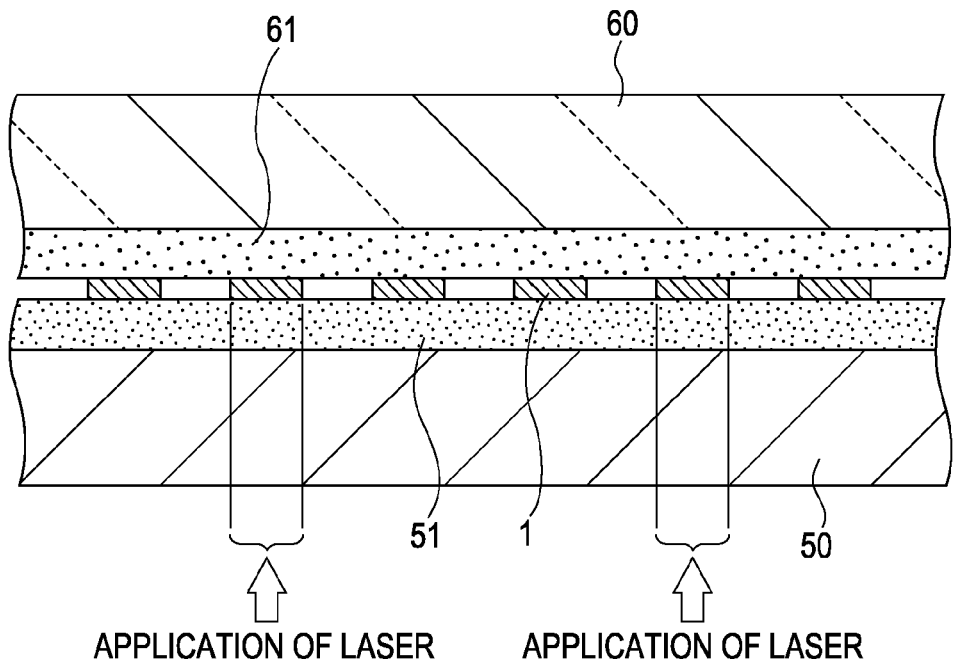
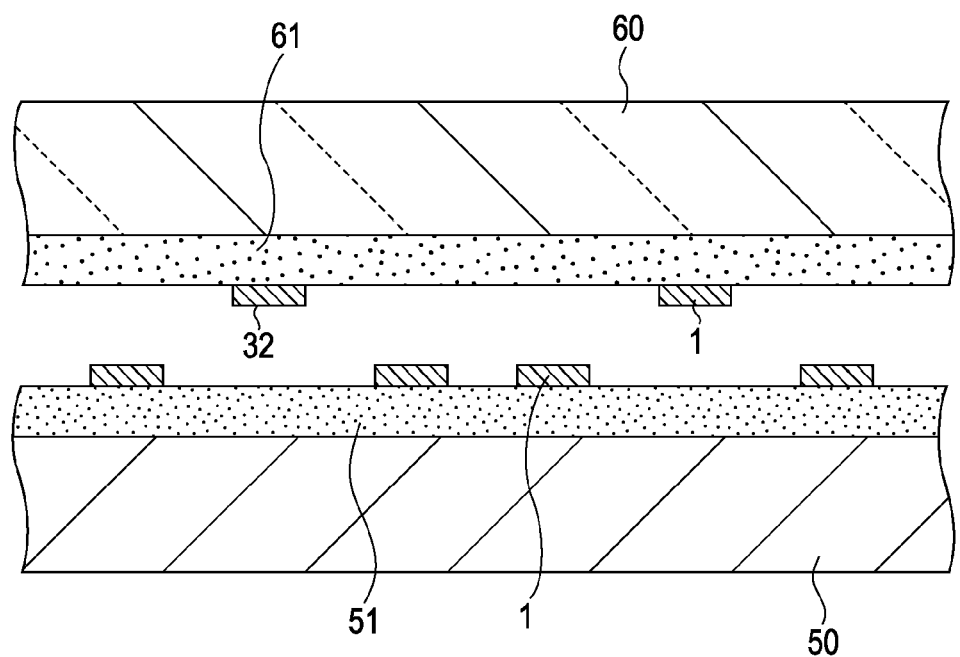

[STEP-210]

[STEP-210] (CONTINUATION)

FIG. 9
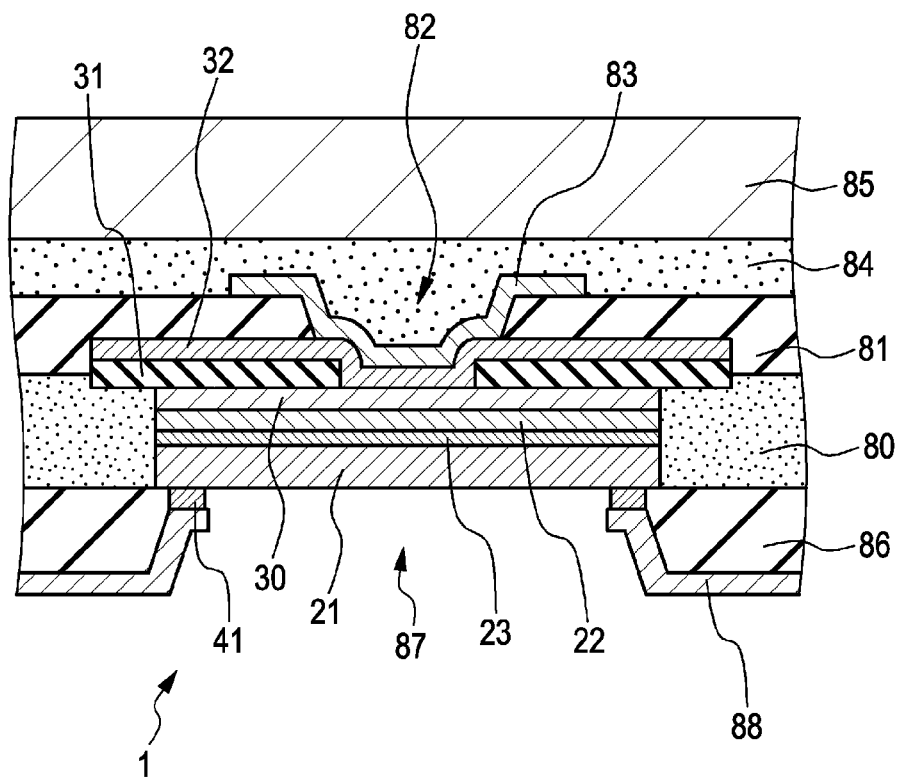
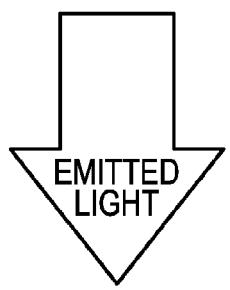

SEMICONDUCTOR LIGHT-EMITTING DEVICE AND METHOD FOR MANUFACTURING THE SAME

RELATED APPLICATION DATA

This application is a division of U.S. patent application Ser. No. 12/632,404, filed on Dec. 7, 2009, the entirety of which is incorporated herein by reference to the extent permitted by law. The present invention claims priority to and contains subject matter related to Japanese Patent Application JP 2008-317083 filed in the Japan Patent Office on Dec. 12, 2008, the entire contents of which being incorporated herein by reference.

BACKGROUND

The present invention relates to a semiconductor light-emitting device and a method for manufacturing the semiconductor light-emitting device.

Semiconductor light-emitting devices such as light-emitting diodes (LEDs), for example, include a light-emitting portion 20 composed of a projecting laminated body obtained by laminating an n conductivity type first compound semiconductor layer 21, an active layer 23, and a p conductivity type second compound semiconductor layer 22 in sequence on a semiconductor light-emitting device manufacturing substrate (hereinafter may be simply referred to as a substrate 10). A first electrode (n-side electrode) 41 is disposed on the substrate 10 or an exposed portion 21a of the exposed first compound semiconductor layer 21. A second electrode (p-side electrode) 130 is disposed on the top face of the second compound semiconductor layer 22. Such semiconductor light-emitting devices can be classified into two types of devices such as a semiconductor light-emitting device in which light from the active layer 23 is emitted through the second compound semiconductor layer 22 and a semiconductor light-emitting device in which light from the active layer 23 is emitted through the first compound semiconductor layer 21 (called a bottom emission type for the sake of convenience).

In a bottom emission type semiconductor light-emitting device of the related art, normally, a reflecting electrode that reflects visible light from the active layer 23 is often used as the second electrode 130 as shown in FIG. 10 to maintain high light-emitting efficiency. The second electrode 130 as a reflecting electrode includes, for example, a lower layer 131 composed of silver (Ag) and an upper layer 132 composed of nickel (Ni) (e.g., refer to C. H. Chou, et al., "High thermally stable Ni/Ag(Al) alloy contacts on p-GaN", Applied Physics Letters 90, 022102 (2007)). Herein, since the lower layer 131 is composed of silver (Ag), a high light reflectance can be achieved. In addition, since the upper layer 132 is composed of nickel (Ni), the degradation caused by oxidation of the lower layer 131 and the occurrence of migration are prevented. In the drawing, reference numeral 42 denotes an insulating layer and reference numerals 43A and 43B denote contact portions.

Normally, the upper layer 132 covers the lower layer 131. Herein, the distance from the edge of the lower layer 131 to the edge of the upper layer 132 is defined as $D_1$. The region of the upper layer 132 from the edge of the lower layer 131 to the edge of the upper layer 132 is referred to as an upper layer protruding region for the sake of convenience. The distance from the edge of the upper layer 132 to the edge of the projecting laminated body is defined as $D_2$. The region of the projecting laminated body from the edge of the upper layer 132 to the edge of the laminated body is referred to as a laminated body exposed region for the sake of convenience. The upper layer protruding region surrounds the lower layer 131 so as to form a frame. The laminated body exposed region surrounds the upper layer protruding region so as to form a frame.

SUMMARY

Normally, part of light emitted in the active layer 23 is reflected between the laminated body and the substrate 10. When part of the reflected light reaches the upper layer protruding region, some of the part of the reflected light is absorbed at the upper layer 132 composed of nickel and constituting the upper layer protruding region and the reminder is reflected. As described above, the upper layer protruding region functions as a light-absorbing region, thereby posing a problem in that the light extraction efficiency as the entire semiconductor light-emitting device is reduced. Furthermore, an electric current is not injected into the laminated body exposed region from the second electrode 130, thereby posing a problem in that current density is increased at the light-emitting portion and thus the light-emitting intensity is decreased due to a luminance saturation phenomenon.

Typical values of $D_1$ and $D_2$ are 1 μm. Thus, in a large semiconductor light-emitting device including a projecting laminated body having a size of about 0.35 mm×0.35 mm, the total area of the laminated body exposed region and the upper layer protruding region is at most 2% of the area of the projecting laminated body. However, in a minute semiconductor light-emitting device including a projecting laminated body having a size of about 10 μm×10 μm, the total area of the laminated body exposed region and the upper layer protruding region accounts for as much as 64% of the area of the projecting laminated body. Therefore, the light reflecting effect produced by the lower layer 131 composed of silver (Ag) is decreased in such a minute semiconductor light-emitting device. Moreover, in such a minute semiconductor light-emitting device, the light extraction efficiency as the entire semiconductor light-emitting device is further reduced, and the light-emitting intensity is further decreased due to a luminance saturation phenomenon.

Accordingly, it is desirable to provide a semiconductor light-emitting device having a structure and a construction that can prevent the light reflecting effect of the second electrode from being decreased and can suppress the occurrence of migration without causing a decrease in the light extraction efficiency as the entire semiconductor light-emitting device and a decrease in the light-emitting intensity due to a luminance saturation phenomenon. It is also desirable to provide a method for manufacturing such a semiconductor light-emitting device.

According to an embodiment of the present invention, there is provided a semiconductor light-emitting device including:

(A) a light-emitting portion obtained by laminating in sequence a first compound semiconductor layer having a first conductivity type, an active layer, and a second compound semiconductor layer having a second conductivity type that is different from the first conductivity type;

(B) a first electrode electrically connected to the first compound semiconductor layer;

(C) a transparent conductive material layer formed on the second compound semiconductor layer;

(D) an insulating layer composed of a transparent insulating material and having an opening, the insulating layer being formed on the transparent conductive material layer; and (E) a second electrode that reflects light from the light-emitting portion, the second electrode being formed on the transparent conductive material layer exposed at a bottom of the opening and on the insulating layer in a continuous manner, wherein, assuming that an area of the active layer constituting the light-emitting portion is $S_1$, an area of the transparent conductive material layer is $S_2$, an area of the insulating layer is $S_3$, and an area of the second electrode is $S_4$, $S_1 \leq S_2 < S_3$ and $S_2 < S_4$ are satisfied.

According to another embodiment of the present invention, there is provided a method for manufacturing a semiconductor light-emitting device including the steps of:

(a) forming, in sequence, a first compound semiconductor layer having a first conductivity type, an active layer, and a second compound semiconductor layer having a second conductivity type that is different from the first conductivity type on a principal surface of a semiconductor light-emitting device manufacturing substrate;

(b) forming a transparent conductive material layer on the second compound semiconductor layer;

(c) forming an insulating layer on the transparent conductive material layer, the insulating layer being composed of a transparent insulating material and having an opening;

(d) forming a second electrode that reflects light from a light-emitting portion on the transparent conductive material layer exposed at a bottom of the opening and on the insulating layer in a continuous manner;

(e) bonding the second electrode to a supporting substrate and removing the semiconductor light-emitting device manufacturing substrate; and (f) patterning the first compound semiconductor layer, the active layer, the second compound semiconductor layer, and the transparent conductive material layer together with the insulating layer and the second electrode to obtain the light-emitting portion in which the first compound semiconductor layer, the active layer, and the second compound semiconductor layer are laminated in sequence, wherein, assuming that an area of the active layer constituting the light-emitting portion is $S_1$, an area of the transparent conductive material layer is $S_2$, an area of the insulating layer is $S_3$, and an area of the second electrode is $S_4$, $S_1 \leq S_2 < S_3$ and $S_2 < S_4$ are satisfied.

In the semiconductor light-emitting device or the method for manufacturing the semiconductor light-emitting device according to an embodiment of the present invention (hereinafter may be collectively called "the present invention"), the transparent conductive material layer preferably transmits 90% or more of light emitted from the light-emitting portion. In other words, such a transmittance is a value obtained by forming a thin film having the same material as that constituting the transparent conductive material layer and having the same thickness as the transparent conductive material layer, applying light having the same wavelength as that emitted from the light-emitting portion to the thin film, and measuring the percentage (light transmittance) at which the thin film transmits the light. To achieve such a light transmittance, the thickness of the transparent conductive material layer may be suitably determined and the material constituting the transparent conductive material layer may be suitably selected. Examples of the material constituting the transparent conductive material layer include not only metals such as gold (Au), nickel (Ni), and platinum (Pt) and metal oxides such as $RuO_2$ but also transparent conductive materials.

Examples of the transparent conductive materials include indium tin oxide (ITO) (including Sn-doped $In_2O_3$, crystalline ITO, and amorphous ITO), indium zinc oxide (IZO), F-doped $In_2O_3$ (IFO), tin oxide ($SnO_2$), Sb-doped $SnO_2$ (ATO), F-doped $SnO_2$ (FTO), zinc oxide (ZnO) (including Al-doped ZnO and B-doped ZnO), spinel-type oxides, and oxides having a $YbFe_2O_4$ structure.

In the present invention including the above-described preferable form, the insulating layer can be composed of silicon oxide ($SiO_x$), silicon nitride ($SiN_y$), silicon oxynitride ($SiO_xN_y$), tantalum oxide ($Ta_2O_5$), zirconium oxide ($ZrO_2$), aluminum oxide ($Al_2O_3$), aluminum nitride (AlN), titanium oxide ($TiO_2$), magnesium oxide (MgO), chromium oxide ($CrO_x$), vanadium oxide ($VO_x$), tantalum nitride (TaN), or a dielectric multilayer film (for example, a dielectric multilayer film having a structure obtained by alternately laminating thin films with a low refractive index composed of $SiO_2$ or the like and thin films with a high refractive index composed of $TiO_2$, $Ta_2O_5$, or the like). The transparent insulating material constituting the insulating layer is preferably a material that transmits 95% or more of light emitted from the light-emitting portion. The insulating layer can be formed by various physical vapor deposition (PVD) methods or various chemical vapor deposition (CVD) methods in accordance with the material to be used. The opening can be formed by a combined method of lithography and etching.

In the present invention including the above-described preferable form and structure, the second electrode is preferably composed of silver, a silver alloy, aluminum, or an aluminum alloy. Examples of the silver alloy include a silver alloy containing 1% or less by weight of indium (In) and a silver alloy containing 0.1 to 10% by weight of palladium and 0.1 to 3% by weight of at least one element selected from copper, aluminum, gold, platinum, tantalum, chromium, titanium, nickel, cobalt, and silicon. An Example of the aluminum alloy includes an aluminum alloy containing 5% or less of cobalt (Co), 5% of nickel (Ni), and 1% of carbon (C) on a molar basis.

In the present invention including the above-described preferable form and structure, light from the active layer is preferably emitted to the outside through the first compound semiconductor layer.

In the method for manufacturing the semiconductor light-emitting device according to an embodiment of the present invention including the above-described preferable form and structure, the second electrode can be bonded to the supporting substrate by a method using an adhesive, a metal bonding method, a semiconductor bonding method, or a metal-semiconductor bonding method. The semiconductor light-emitting device manufacturing substrate can be removed by wet etching, dry etching, laser ablation, or heating. The first compound semiconductor layer, the active layer, the second compound semiconductor layer, and the transparent conductive material layer, or the insulating layer and the second electrode can be patterned by dry etching such as reactive ion etching (RIE) or wet etching. Herein, the insulating layer and the second electrode may be patterned after the first compound semiconductor layer, the active layer, the second compound semiconductor layer, and the transparent conductive material layer are patterned. Alternatively, the first compound semiconductor layer, the active layer, the second compound semiconductor layer, and the transparent conductive material layer may be patterned after the insulating layer and the second electrode are patterned; bonding to the supporting substrate is performed; and the semiconductor light-emitting device manufacturing substrate is removed. Furthermore, the first compound semiconductor layer, the active layer, and the second compound semiconductor layer, and the transparent conductive material layer may be patterned in a continuous manner (in this case, normally $S_1=S_2$). Alternatively, the transparent conductive material layer may be patterned after the first compound semiconductor layer, the active layer, and the second compound semiconductor layer are patterned (in this case, normally $S_1<S_2$). The first compound semiconductor layer, the active layer, and the second compound semiconductor layer may be patterned after the transparent conductive material layer is patterned; bonding to the supporting substrate is performed; and the semiconductor light-emitting device manufacturing substrate is removed (in this case also, normally $S_1<S_2$).

In the present invention including the above-described preferable form and structure, the transparent conductive material layer and the second electrode can be formed by various PVD methods, various CVD methods, or plating methods. Examples of the PVD methods include (a) various vacuum deposition methods such as electron beam heating, resistance heating, flash deposition, and pulse laser deposition (PLD); (b) plasma deposition; (c) various sputtering methods such as diode sputtering, direct current (DC) sputtering, DC magnetron sputtering, radio frequency (RF) sputtering, magnetron sputtering, ion beam sputtering, and bias sputtering; (d) various ion plating methods such as a DC method, an RF method, a multi-cathode method, an activation reaction method, a hollow cathode discharge (HCD) method, an electric field deposition method, an RF ion plating method, and a reactive ion plating method; (e) ion vapor deposition (IVD). Examples of the CVD methods include atmospheric pressure CVD, reduced pressure CVD, thermal CVD, plasma CVD, photo CVD, and laser CVD.

In the present invention including the above-described preferable form and structure, the first electrode can be composed of, for example, Ti, TiW, TiMo, Ti/Ni/Au, Ti/Pt/Au, (Ti/)TiW/Pt/Au, (Ti/)TiW/Pd/TiW/Pt/Au, Al, an aluminum alloy, AuGe, or AuGe/Ni/Au. Note that the layer indicated on the left side of "/" is situated closer to the active layer than that indicated on the right side of "/". Alternatively, the first electrode can be composed of a transparent conductive material such as ITO, IZO, ZnO:Al, or ZnO:B. For example, a contact portion (pad portion) constituted by a metal multilayer having a laminated structure of [adhesive layer (e.g., Ti layer or Cr layer)]/[barrier metal layer (e.g., Pt layer, Ni layer, TiW layer, or Mo layer)]/[metal layer having compatibility with mounting (e.g., Au layer)] such as Ti layer/Pt layer/Au layer may be optionally disposed on the first electrode and the second electrode (including the extending portion thereof). The first electrode and the contact portion (pad portion) can be formed by various PVD methods such as vacuum deposition and sputtering, various CVD methods, or plating methods.

In the method for manufacturing the semiconductor light-emitting device according to an embodiment of the present invention including the above-described preferable form and structure, examples of the semiconductor light-emitting device manufacturing substrate include a GaAs substrate, a GaN substrate, a SiC substrate, an alumina substrate, a sapphire substrate, a ZnS substrate, a ZnO substrate, an AlN substrate, a LiMgO substrate, a LiGaO$_2$ substrate, a MgAl$_2$O$_4$ substrate, an InP substrate, a Si substrate, a Ge substrate, a GaP substrate, an AlP substrate, an InN substrate, an AlGaInN substrate, an AlGaN substrate, an AlInN substrate, a GaInN substrate, an AlGaInP substrate, an AlGaP substrate, an AlInP substrate, a GaInP substrate, and theses substrates each having a base layer or a buffer layer formed on the surface (principal surface) thereof.

The semiconductor light-emitting device according to an embodiment of the present invention including the above-described preferable form and structure or the semiconductor light-emitting device obtained by the method for manufacturing a semiconductor light-emitting device according to an embodiment of the present invention (hereinafter may be collectively called "a semiconductor light-emitting device or the like according to an embodiment of the present invention") is first disposed on the semiconductor light-emitting device manufacturing substrate. However, the semiconductor light-emitting device manufacturing substrate is removed in the end. The semiconductor light-emitting device or the like can be mounted on the mount substrate described below in the end. Examples of the supporting substrate and the mount substrate include glass sheets, metal sheets, alloy sheets, ceramic sheets, plastic sheets, and plastic films. A wiring line may be disposed on the supporting substrate to connect the second electrode or the first electrode to the wiring line.

Examples of the compound semiconductor layers including the active layer in the semiconductor light-emitting device or the like according to an embodiment of the present invention include GaN compound semiconductors (including an AlGaN mixed crystal, an AlGaInN mixed crystal, or a GaInN mixed crystal), GaInNAs compound semiconductors (including a GaInAs mixed crystal or a GaNAs mixed crystal), AlGaInP compound semiconductors, AlAs compound semiconductors, AlGaInAs compound semiconductors, AlGaAs compound semiconductors, GaInAs compound semiconductors, GaInAsP compound semiconductors, GaInP compound semiconductors, GaP compound semiconductors, InP compound semiconductors, InN compound semiconductors, and AlN compound semiconductors. Examples of the n-type impurities added to the compound semiconductor layers include silicon (Si), selenium (Se), germanium (Ge), tin (Sn), carbon (C), and titanium (Ti). Examples of the p-type impurities include zinc (Zn), magnesium (Mg), beryllium (Be), cadmium (Cd), calcium (Ca), barium (Ba), and oxygen (O). The active layer may be composed of a single compound semiconductor layer or may have a single quantum well structure (QW structure) or a multiple quantum well structure (MQW structure). The compound semiconductor layer including the active layer can be formed by metal-organic chemical vapor deposition (MOCVD or MOVPE), metal-organic molecular beam epitaxy (MO-MBE), or hydride vapor phase epitaxy (HYPE) in which halogens contribute to transportation or reaction.

Examples of gas used in MOCVD for forming the compound semiconductor layer include common gases such as a trimethylgallium (TMG) gas, a triethylgallium (TEG) gas, a trimethylaluminum (TMA) gas, a trimethylindium (TMI) gas, and arsine (AsH$_3$). Examples of nitrogen source gas include an ammonia gas and a hydrazine gas. For example, when silicon (Si) is added as n-type impurities (n-type dopants), a monosilane (SiH$_4$) gas may be used as a Si source, and, when selenium (Se) is added, a H$_2$Se gas may be used as a Se source. On the other hand, when magnesium (Mg) is added as p-type impurities (p-type dopants), a cyclopentadienyl magnesium gas, a methylcyclopentadienyl magnesium gas, or a bis(cyclopentadienyl) magnesium (Cp$_2$Mg) gas may be used as a Mg source, and, when zinc (Zn) is added, dimethylzinc (DMZ) can be used as a Zn source. In addition to Si, examples of n-type impurities (n-type dopants) include Ge, Se, Sn, C, and Ti. In addition to Mg, examples of p-type impurities manufacturing of a semiconductor red light-emitting device, examples of usable gas include trimethylaluminum (TMA), triethylaluminum (TEA), trimethylgallium (TMG), triethylgallium (TEG), trimethylindium (TMI), triethylindium (TEI), phosphine ($PH_3$), arsine, dimethylzinc (DMZ), diethylzinc (DEZ), $H_2S$, hydrogen selenide ($H_2Se$), and biscyclopentanediethylzinc.

Specifically, a light-emitting diode (LED) can be obtained from the semiconductor light-emitting device or the like according to an embodiment of the present invention. For example, the size of the light-emitting diode is $3\times10^{-11}$ $m^2 \leq S_1 \leq 3\times10^{-7}$ $m^2$, preferably $1\times10^{-10}$ $m^2 \leq S_1 \leq 1\times10^{-9}$ $m^2$, where $S_1$ is an area of the active layer.

The semiconductor light-emitting device or the like according to an embodiment of the present invention may be mounted on the mount substrate. In this case, a plurality of semiconductor light-emitting devices should be mounted on the mount substrate. The number of semiconductor light-emitting devices, the type thereof, the way of mounting (arrangement), the pitch, and the like may be determined in accordance with, for example, the specifications, usage, and functions of products including the semiconductor light-emitting devices. Examples of the products obtained by mounting the semiconductor light-emitting devices on the mount substrate include an image display apparatus, a backlight using semiconductor light-emitting devices, and a lighting apparatus. For example, a device using nitride-based group III-V compound semiconductors can be used as a semiconductor red light-emitting device (red light-emitting diode), a semiconductor green light-emitting device (green light-emitting diode), and a semiconductor blue light-emitting device (blue light-emitting diode). Furthermore, for example, a device using AlGaInP compound semiconductors can be used as a semiconductor red light-emitting device (red light-emitting diode). In addition, specifically, a light-emitting diode (LED), an edge-emitting semiconductor laser, a surface-emitting laser device (vertical cavity surface emitting laser (VCSEL)), and the like can be obtained from the semiconductor light-emitting device or the like according to an embodiment of the present invention.

In the present invention, the second electrode is formed on the transparent conductive material layer exposed at a bottom of the opening and on the insulating layer in a continuous manner and is not directly in contact with the light-emitting portion. Thus, the migration of a material (atoms) constituting the second electrode to the light-emitting portion can be prevented with certainty. In addition, since $S_2<S_3$ is satisfied, the occurrence of migration can be prevented with more certainty as described below. Since $S_2<S_4$ is satisfied, the light reflecting effect of the second electrode can be certainly prevented from being decreased. Furthermore, the satisfaction of $S_1$ $S_2$ does not cause a decrease in the light extraction efficiency as the entire semiconductor light-emitting device and a decrease in the light-emitting intensity due to a luminance saturation phenomenon. If the value of $S_3/S_2$ or $S_4/S_2$ is decreased to the limitation of alignment precision in manufacturing, the size as the entire semiconductor light-emitting device can be decreased to its limitation and semiconductor light-emitting devices can be formed at a narrower pitch even if the active layer has the same area. Consequently, a larger number of semiconductor light-emitting devices can be obtained from a single crystal growth substrate. Accordingly, the manufacturing cost of the semiconductor light-emitting device can be reduced.

BRIEF DESCRIPTION OF THE DRAWINGS

FIGS. 2A and 2B are partial sectional views schematically showing a laminated body or the like for describing a method for manufacturing the semiconductor light-emitting device of Example 1;

FIGS. 4A and 4B are partial sectional views schematically showing a laminated body or the like for describing a method for manufacturing the semiconductor light-emitting device of Example 1 after FIG. 3B;

FIGS. 7A and 7B are partial sectional views schematically showing a semiconductor light-emitting device or the like for describing a method for manufacturing the image display apparatus of Example 2 after FIG. 6B;

FIG. 9 is a partial sectional view schematically showing a semiconductor light-emitting device or the like for describing a method for manufacturing the image display apparatus of Example 2 after FIG. 8B.

DESCRIPTION OF THE PREFERRED EMBODIMENTS

The present invention will now be described on the basis of Examples with reference to the drawings.

EXAMPLE 1

Example 1 relates to a semiconductor light-emitting device according to an embodiment of the present invention and a method for manufacturing the semiconductor light-emitting device. A semiconductor light-emitting device 1 in Example 1 is specifically composed of a light-emitting diode.

Figure 1A:
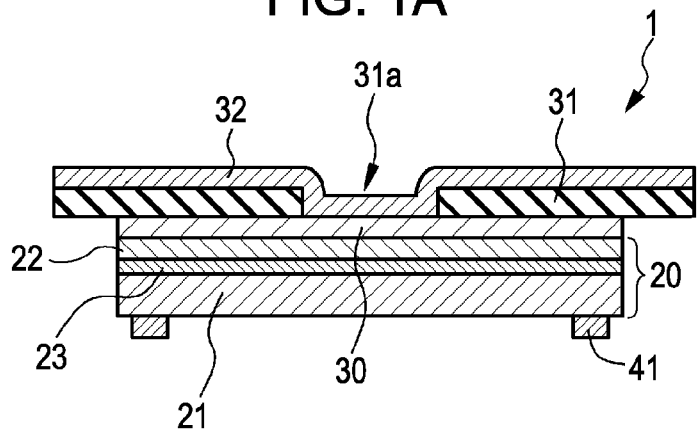
FIGS. 1A and 1B are conceptual diagrams of a semiconductor light-emitting device of Example 1.
Figure 1B:
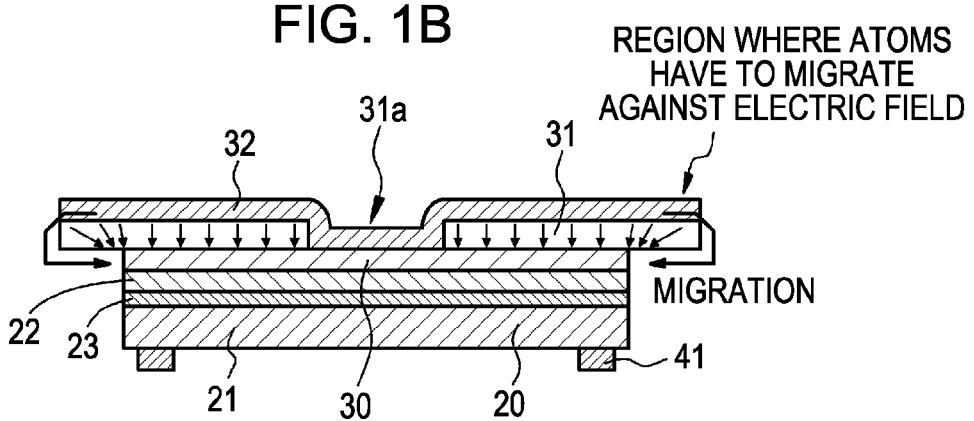
Figure 1C:
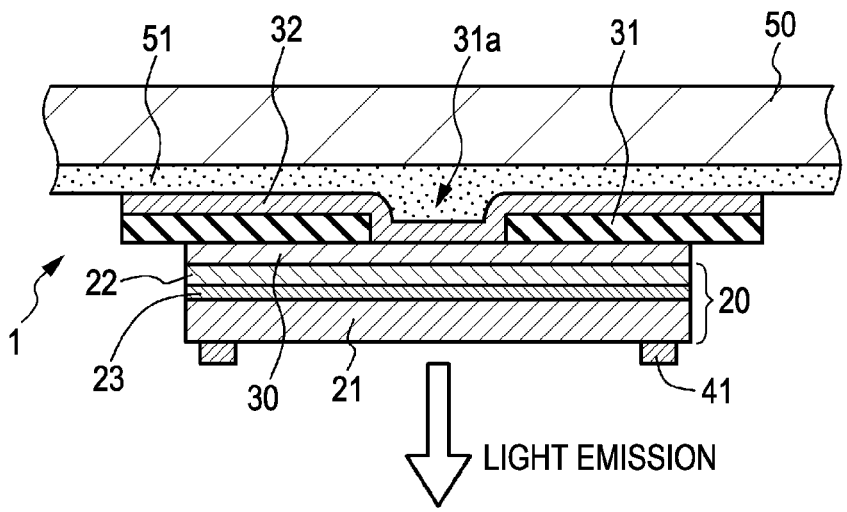
FIG. 1C is a sectional view schematically showing the semiconductor light-emitting device of Example 1.

As shown in FIG. 1A that is a conceptual diagram and FIG. 1C that is a schematic sectional view, the semiconductor light-emitting device 1 of Example 1 includes:

(A) a light-emitting portion 20 obtained by laminating in sequence a first compound semiconductor layer 21 having a first conductivity type (specifically, n type in Example 1), an active layer 23, and a second compound semiconductor layer 22 having a second conductivity type (specifically, p type in Example 1) that is different from the first conductivity type;

(B) a first electrode (n-side electrode) 41 electrically connected to the first compound semiconductor layer 21;

(C) a transparent conductive material layer 30 formed on the second compound semiconductor layer 22;

(D) an insulating layer 31 composed of a transparent insulating material and having an opening 31a, the insulating layer 31 being formed on the transparent conductive material layer 30; and (E) a second electrode (p-side electrode) 32 that reflects light from the light-emitting portion 20, the second electrode 32 being formed on the transparent conductive material layer 30 exposed at a bottom of the opening 31a and on the insulating layer 31 in a continuous manner.

Assuming that an area of the active layer 23 constituting the light-emitting portion 20 is $S_1$, an area of the transparent conductive material layer 30 is $S_2$, an area of the insulating layer 31 is $S_3$, and an area of the second electrode 32 is $S_4$, $S_1 \leq S_2 < S_3$ and $S_2 < S_4$ are satisfied. Specifically, $S_1 = S_2 = 9.6$ µm×9.6 µm and $S_3 = S_4 = 10.0$ µm×10.0 µm in Example 1.

Specifically, in Example 1, the first electrode 41 is formed on a surface of the first compound semiconductor layer 21 opposite to a surface of the first compound semiconductor layer 21 that contacts the active layer 23. The compound semiconductors constituting the first compound semiconductor layer 21, the active layer 23, and the second compound semiconductor layer 22 are composed of $Al_xGa_yIn_{1-X-Y}N$ ($0 \leq X \leq 1$, $0 \leq Y \leq 1$, and $0 \leq X+Y \leq 1$), and more specifically, the compound semiconductors are GaN compound semiconductors. That is to say, the first compound semiconductor layer 21 is composed of Si-doped GaN (GaN:Si), and the active layer 23 is composed of an InGaN layer (well layer) and a GaN layer (barrier layer) and has a multiple quantum well structure. The second compound semiconductor layer 22 is composed of Mg-doped GaN (GaN:Mg). The light-emitting portion 20 has a laminated structure obtained by laminating the first compound semiconductor layer 21, the active layer 23, and the second compound semiconductor layer 22. Furthermore, the first electrode 41 is composed of a metal laminated film having a Ti/Pt/Au structure. The thicknesses of the Ti film and the Pt film are, for example, 50 nm and the thickness of the Au film is, for example, 2 µm. The transparent conductive material layer 30 is composed of a gold layer having a thickness of 2 nm. The insulating layer 31 is composed of silicon oxide ($SiO_x$ and X=2 in Example 1) having a thickness of 0.2 µm. The second electrode 32 is composed of a silver alloy having a thickness of 0.2 µm. The transmittance of light whose wavelength is 520 nm to a gold thin film having a thickness of 2 nm is about 92%, and the sheet resistance of the gold thin film is 12 Ω/square. The transmittance of the light to the insulating layer 31 having a thickness of 0.2 µm is 99% or more, and the size of the opening 31a formed in the insulating layer 31 is 3 µm×3 µm. The light reflectance of the second electrode 32 composed of a silver alloy is about 95%. The light from the active layer 23 is emitted to the outside through the first compound semiconductor layer 21.

Figure 10:
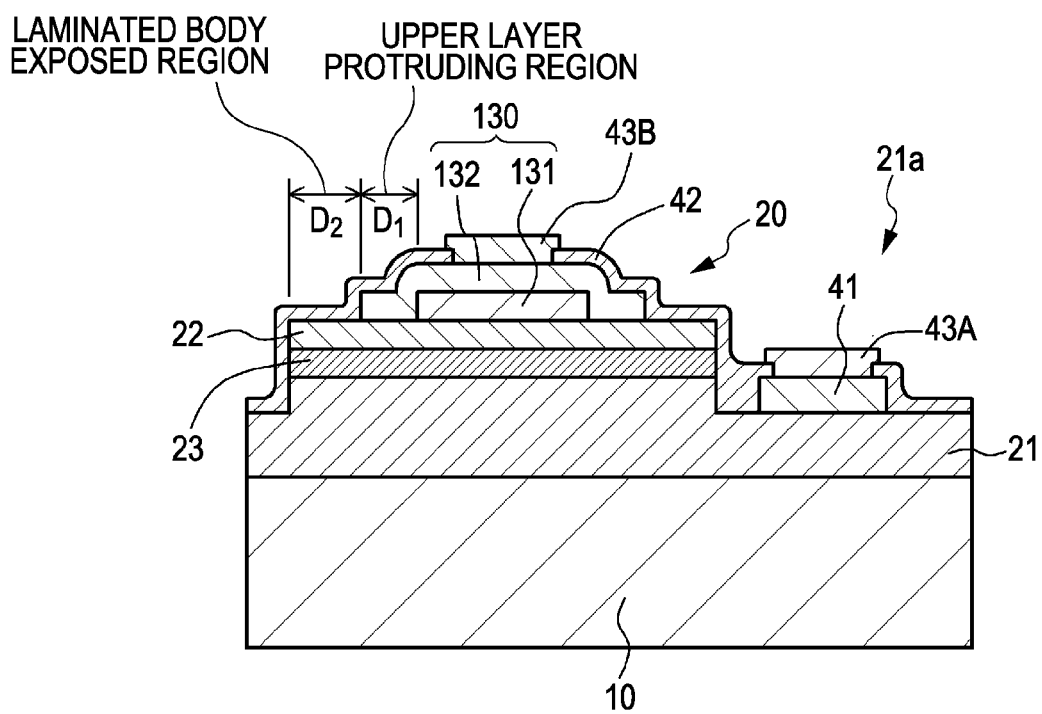
FIG. 10 is a partial sectional view schematically showing a semiconductor light-emitting device of the related art.

In the semiconductor light-emitting device with a structure of the related art shown in FIG. 10 (hereinafter referred to as a semiconductor light-emitting device of Comparative Example 1), at least $D_1 = D_2 = 1.0$ µm is necessary. Thus, in the semiconductor light-emitting device of Comparative Example 1, assuming that the size of the active layer is 10.0 µm×10.0 µm, the size of the active layer in a portion into which an electric current is injected from the upper layer 132 constituting the second electrode 130 is about 8 µm×8 µm. The size of the lower layer (light reflecting layer) 131 constituting the second electrode 130 is 6.0 µm×6.0 µm.

When a value of the electric current that should be injected into the semiconductor light-emitting device is 100 µA, the current density, the ratio of a luminance saturation suppressing effect, and the ratio of the area of the second electrode or the upper layer to the total area $S_1$ (10 µm×10 µm) of the active layer in the semiconductor light-emitting devices of Example 1 and Comparative Example 1 are shown in Table 1 below.

TABLE 1

Current density

Example 1: $(100 \times 10^{-6})/(9.6 \times 9.6 \times 10^{-8}) = 109$ A/cm$^2$
Comparative Example 1: $(100 \times 10^{-6})/(8 \times 8 \times 10^{-8}) = 156$ A/cm$^2$
Ratio of luminance saturation suppressing effect due to current density decrease (light-emitting efficiency at current density in Comparative Example 1 is 1.0)

Light-emitting efficiency at current density in Example 1: 1.1 (actual value)
Light-emitting efficiency at current density in Comparative Example 1: 1.0
Area ratio of second electrode or upper layer Example 1: 100%
Comparative Example 1: 36%

As described above, the current density can be decreased in the semiconductor light-emitting device 1 of Example 1. The luminance saturation suppressing effect in Example 1 is 1.1 times that in Comparative Example 1. In addition, the area ratio of the second electrode to the active layer is 100%, which is 2.8 times the area ratio in Comparative Example 1. As a result, the optical output of the semiconductor light-emitting device 1 can be increased.

As shown in FIG. 1B that is a conceptual diagram of the semiconductor light-emitting device 1, when the semiconductor light-emitting device 1 is operated, an electric field is formed from the second electrode 32 to the transparent conductive material layer 30 through the insulating layer 31, and the electric field is concentrated at the edge of the transparent conductive material layer 30. Although silver atoms constituting the second electrode 32 migrate along the electric field, the migration is blocked by the insulating layer 31. The possible migration paths through which the silver atoms cross the insulating layer 31 are indicated by arrows labeled "migration" in FIG. 1B. However, since some of the migration paths are in the direction that opposes the electric field, the silver atoms do not easily migrate in reality. In other words, the structure of the semiconductor light-emitting device 1 of Example 1 shown in FIGS. 1A and 1C is a structure that can prevent the occurrence of migration with certainty.

In Example 1, the second electrode 32 is formed on the transparent conductive material layer 30 exposed at a bottom of the opening 31a and on the insulating layer 31 in a continuous manner, and thus does not contact the light-emitting portion 20. Therefore, the migration of a material (atoms) constituting the second electrode 32 to the light-emitting portion 20 can be prevented with certainty. In addition, since $S_2 < S_3$ is satisfied, the occurrence of migration can be prevented with more certainty as described above. Since $S_2 < S_4$ is satisfied, the light reflecting effect of the second electrode 32 can be certainly prevented from being decreased. Furthermore, the satisfaction of $S_1 \leq S_2$ does not cause a decrease in the light extraction efficiency as the entire semiconductor light-emitting device and a decrease in the light-emitting intensity due to luminance saturation phenomenon.

A method for manufacturing the semiconductor light-emitting device 1 of Example 1 will now be described with reference to the drawings.

Step-100A

First, a first compound semiconductor layer 21A having a first conductivity type, an active layer 23A, a second compound semiconductor layer 22A having a second conductivity type that is different from the first conductivity type are formed in sequence on a principal surface of a semiconductor light-emitting device manufacturing substrate 10. Because the first compound semiconductor layer 21A, the active layer 23A, and the second compound semiconductor layer 22A are not yet patterned, "A" is added at the end of their reference numeral. The same is applied to reference numerals that denote each layer in the following description. Specifically, the semiconductor light-emitting device manufacturing substrate 10 composed of sapphire is inserted into an MOCVD apparatus. After substrate cleaning is performed in a carrier gas composed of hydrogen at a substrate temperature of 1050° C. for 10 minutes, the substrate temperature is decreased to 500° C. On the basis of an MOCVD method, a trimethylgallium (TMG) gas that is a raw material of gallium is supplied while an ammonia gas that is a raw material of nitrogen is supplied, to perform crystal growth on a surface of the semiconductor light-emitting device manufacturing substrate 10. Consequently, a base layer 11 composed of GaN is formed on the surface and the supply of the TMG gas is then stopped.

Step-100B

Subsequently, a light-emitting portion 20A obtained by laminating in sequence an n conductivity type first compound semiconductor layer 21A, an active layer 23A, and a p conductivity type second compound semiconductor layer 22A is formed on the semiconductor light-emitting device manufacturing substrate 10.

Specifically, on the basis of the MOCVD method, crystal growth is performed on the base layer 11 by increasing the substrate temperature to 1020° C. and then supplying a monosilane ($SiH_4$) gas that is a raw material of silicon at atmospheric pressure. Consequently, an n conductivity type first compound semiconductor layer 21A having a thickness of 3 μm and composed of Si-doped GaN (GaN:Si) is formed on the base layer 11. The doping concentration is, for example, about $5 \times 10^{18}$ cm$^{-3}$.

After that, the supply of the TMG gas and the $SiH_4$ gas is temporarily stopped and the substrate temperature is decreased to 750° C. By supplying a triethylgallium (TEG) gas and a trimethylindium (TMI) gas through valve switching, crystal growth is performed to form an active layer 23A composed of InGaN and GaN and having a multiple quantum well structure.

For example, a light-emitting diode with a light-emitting wavelength of 400 nm is obtained by providing a multiple quantum well structure (e.g., constituted by two layers of well) composed of GaN (thickness: 7.5 nm) and InGaN (thickness: 2.5 nm) having an In component of about 9%. Alternatively, a blue light-emitting diode with a light-emitting wavelength of 460 nm±10 nm is obtained by providing a multiple quantum well structure (e.g., constituted by 15 layers of well) composed of GaN (thickness: 7.5 nm) and InGaN (thickness: 2.5 nm) having an In component of 15%. A green light-emitting diode with a light-emitting wavelength of 520 nm±10 nm is obtained by providing a multiple quantum well structure (e.g., constituted by 9 layers of well) composed of GaN (thickness: 15 nm) and InGaN (thickness: 2.5 nm) having an In component of 23%.

After the active layer 23A has been formed, crystal growth is performed on the active layer 23A by stopping the supply of the TEG gas and the TMI gas, switching the nitrogen carrier gas to a hydrogen carrier gas, increasing the substrate temperature to 850° C., and then supplying a TMG gas and a bis(cyclopentadienyl) magnesium ($Cp_2Mg$) gas. Consequently, a second compound semiconductor layer 22A having a thickness of 100 nm and composed of Mg-doped GaN (GaN:Mg) is formed on the active layer 23A. The doping concentration is about $5 \times 10^{19}$ cm$^{-3}$. Subsequently, by stopping the supply of the TMG gas and the $Cp_2Mg$ gas and decreasing the substrate temperature to room temperature, the crystal growth is completed.

Step-100C

After the completion of crystal growth, p-type impurities (p-type dopants) are activated by performing annealing treatment in a nitrogen gas atmosphere at about 800° C. for 10 minutes.

Step-110

A transparent conductive material layer 30A composed of a gold thin film having a thickness of 2 nm is formed on the second compound semiconductor layer 22A by vacuum deposition. Thus, a structure shown in FIG. 2A can be obtained.

Step-120

An insulating layer 31 composed of a transparent insulating material and having an opening 31a is formed on the transparent conductive material layer 30A. Specifically, after an insulating layer 31 composed of $SiO_2$ is entirely formed on the transparent conductive material layer 30A by sputtering, an opening 31a is formed in the insulating layer 31 by lithography and RIE. Thus, a structure shown in FIG. 2B can be obtained.

Step-130

Figure 3A:
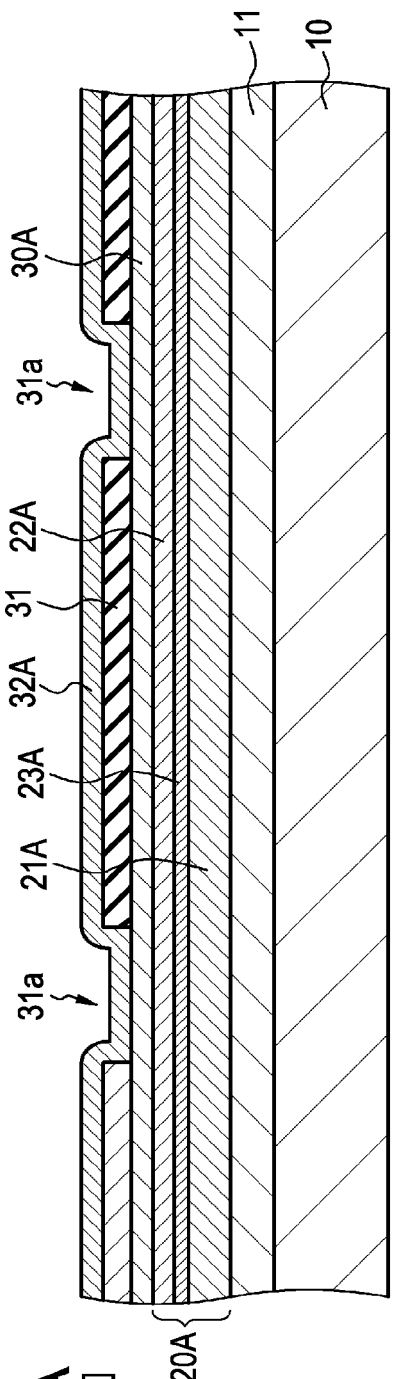
FIGS. 3A and 3B are partial sectional views schematically showing a laminated body or the like for describing a method for manufacturing the semiconductor light-emitting device of Example 1 after FIG. 2B.

A second electrode 32A that reflects light from the light-emitting portion is formed on the transparent conductive material layer 30A exposed at a bottom of the opening 31a and on the insulating layer 31 in a continuous manner by sputtering. Thus, a structure shown in FIG. 3A can be obtained.

Step-140

Figure 3B:
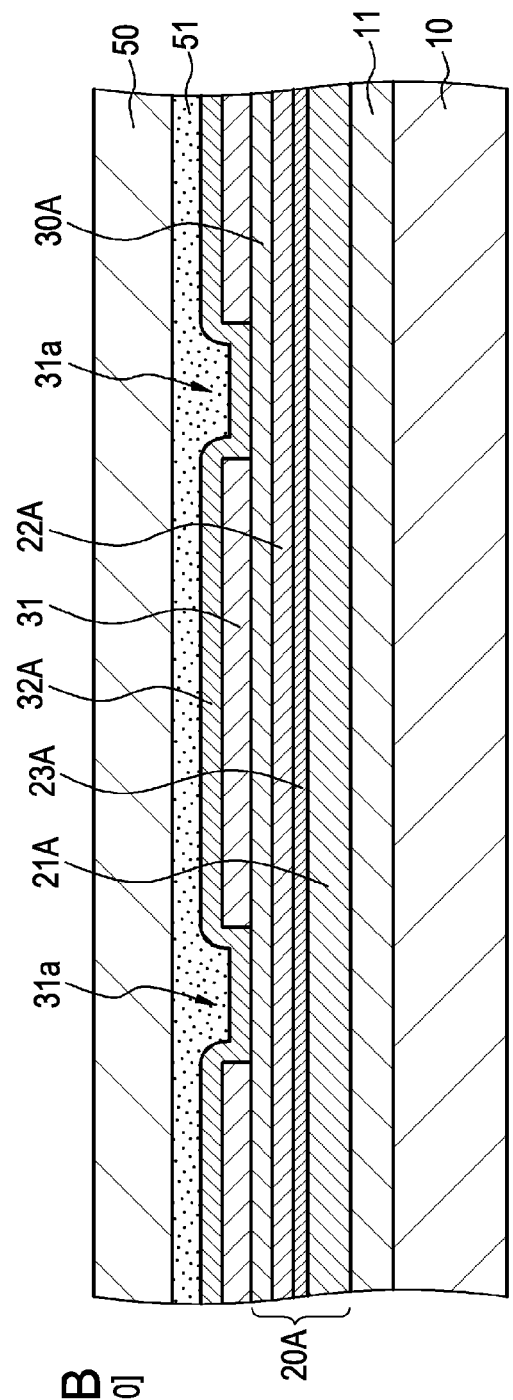

The second electrode 32A and a supporting substrate 50 are attached to each other through an adhesive layer 51 composed of an epoxy adhesive (refer to FIG. 3B). Subsequently, the semiconductor light-emitting device manufacturing substrate 10 is removed by mechanical polishing and wet etching.

Step-150

A patterned resist layer is formed on the exposed first compound semiconductor layer 21A by lithography. First electrodes 41 are then formed on the first compound semiconductor layer 21A by liftoff using the resist layer.

Step-160

A patterned resist layer is formed on the exposed first compound semiconductor layer 21A by lithography. Subsequently, the first compound semiconductor layer 21A, the active layer 23A, the second compound semiconductor layer 22A, and the transparent conductive material layer 30A are patterned by RIE with a $Cl_2$ gas using the resist layer as a mask for etching. The resist layer is then removed.

Thus, as shown in FIG. 4A, a light-emitting portion 20 that is a laminated body constituted by a patterned first compound semiconductor layer 21, a patterned active layer 23, and a patterned second compound semiconductor layer 22 can be obtained. In addition, a patterned transparent conductive material layer 30 can be obtained. After that, a patterned resist layer is formed on the patterned light-emitting portion 20 and the exposed insulating layer 31 by lithography. The insulating layer 31 and the second electrode 32A are patterned by RIE with an $O_2$ gas and a $CF_4$ gas using the resist layer as a mask for etching. The resist layer is then removed. Thus, a structure shown in FIG. 4B can be obtained. In the patterning described above, $S_1 \leq S_2 < S_3$ and $S_2 < S_4$ are satisfied. The distance (formation pitch) between the centers of semiconductor light-emitting devices 1 adjacent to each other is 12.5 μm.

The semiconductor light-emitting device 1 of Example 1 can be manufactured through the steps described above.

Step-170

Subsequently, the supporting substrate 50 can be cut into semiconductor light-emitting devices 1. Furthermore, various semiconductor light-emitting devices (specifically light-emitting diodes) such as a round lamp type device and a surface mounting type device can be manufactured by performing resin molding and packaging.

Figure 5A:
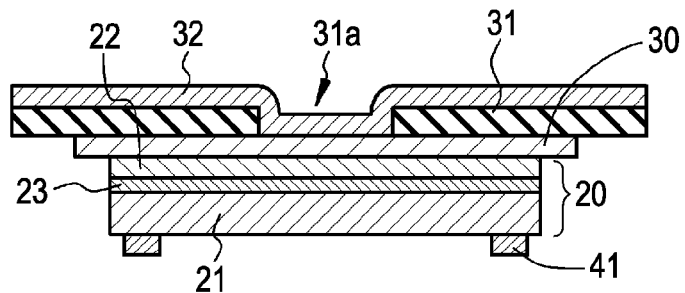
FIGS. 5A to 5D are conceptual diagrams showing modifications of the semiconductor light-emitting device of Example 1.
Figure 5B:
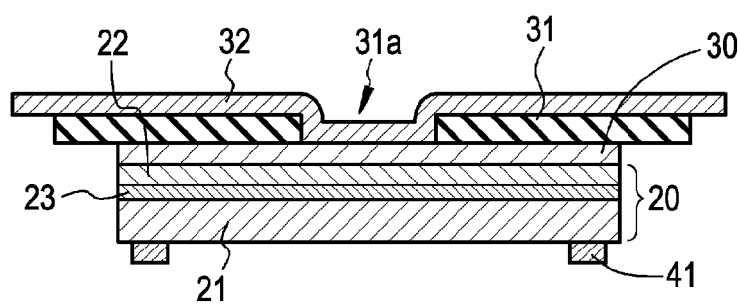
Figure 5C:
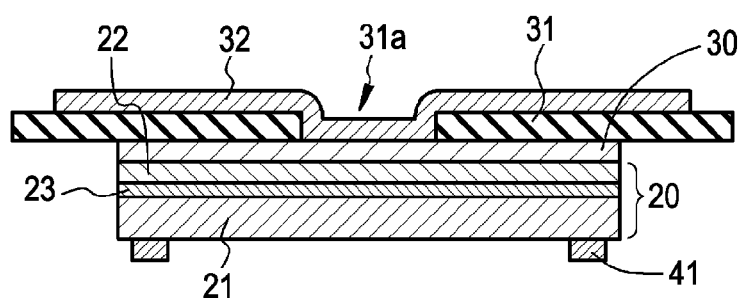
Figure 5D:
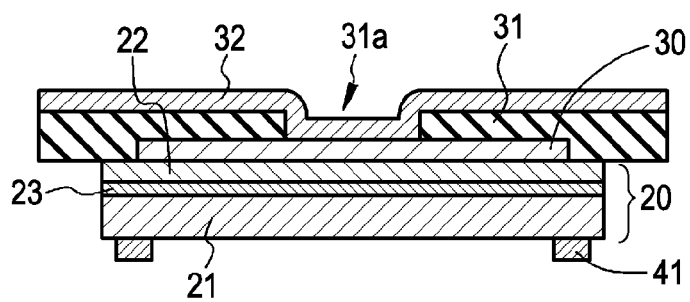

A relationship between the area $S_1$ of the active layer constituting the light-emitting portion, the area $S_2$ of the transparent conductive material layer, the area $S_3$ of the insulating layer, and the area $S_4$ of the second electrode is not limited to the above-described relationship. For example, $S_1<S_2<S_3=S_4$ may be satisfied as shown in FIG. 5A that is a schematic sectional view. Alternatively, $S_1=S_2<S_3<S_4$ may be satisfied as shown in FIG. 5B that is a schematic sectional view, or $S_1=S_2<S_4<S_3$ may be satisfied as shown in FIG. 5C that is a schematic sectional view. Furthermore, a structure shown in FIG. 5D may be adopted when necessary.

EXAMPLE 2

Example 2 is a modification of Example 1. In Example 2, the semiconductor light-emitting devices 1 obtained in Example 1 are rearranged in an array (in a two-dimensional matrix) to manufacture, for example, an image display apparatus. Specifically, in Example 2, the steps described below are performed after Step-160.

Step-200

In this step, semiconductor light-emitting devices 1 are selected at a desired pitch. More specifically, semiconductor light-emitting devices 1 are selected from many semiconductor light-emitting devices 1 that are obtained in Step-160 of Example 1 and are arranged in a two-dimensional matrix, at a pitch of every M devices in an X direction and every N devices in a Y direction. There are prepared a relay substrate 60 on which a weak adhesive layer 61 composed of silicone rubber is formed and a second relay substrate 70 in which an alignment mark (not shown) composed of a metal thin film or the like is formed in a predetermined position and on which an adhesive layer 71 composed of an uncured photosensitive resin is formed.

Examples of the material constituting the relay substrate 60 include glass sheets, metal sheets, alloy sheets, ceramic sheets, semiconductor substrates, and plastic sheets. The relay substrate 60 is held by a position determining apparatus (not shown). With the operation of the position determining apparatus, the positional relationship between the relay substrate 60 and the supporting substrate 50 can be adjusted.

The adhesive layer 71 may be basically composed of any material as long as the material provides an adhesive function by some method. For example, materials providing an adhesive function through the application of energy beams such as light (particularly ultraviolet rays or the like), radial rays (X rays or the like), or electron beams, or materials providing an adhesive function through the application of heat, pressure, or the like can be used. A resin adhesive layer, particularly a photosensitive adhesive, a thermosetting adhesive, or a thermoplastic adhesive can be exemplified as a material that can be easily formed and provide an adhesive function. For example, when a photosensitive adhesive is used, an adhesive function can be provided to an adhesive layer by applying light or ultraviolet rays to the adhesive layer or by applying heat thereto. When a thermosetting adhesive is used, an adhesive function can be provided to an adhesive layer by heating the adhesive layer through the application of light or the like. When a thermoplastic adhesive is used, by selectively heating part of an adhesive layer through the application of light or the like, the part of the adhesive layer can be melted to impart fluidity. In addition, for example, a pressure-sensitive adhesive layer (e.g., composed of an acrylic resin) can be exemplified as an adhesive layer.

Figure 6A:
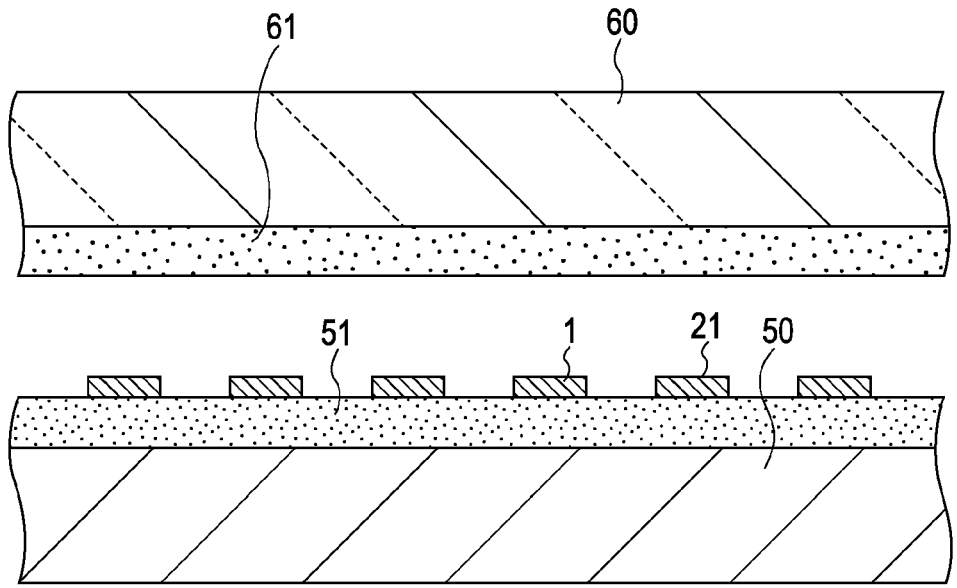
FIGS. 6A and 6B are partial sectional views schematically showing a semiconductor light-emitting device or the like for describing a method for manufacturing an image display apparatus of Example 2.
Figure 6B:
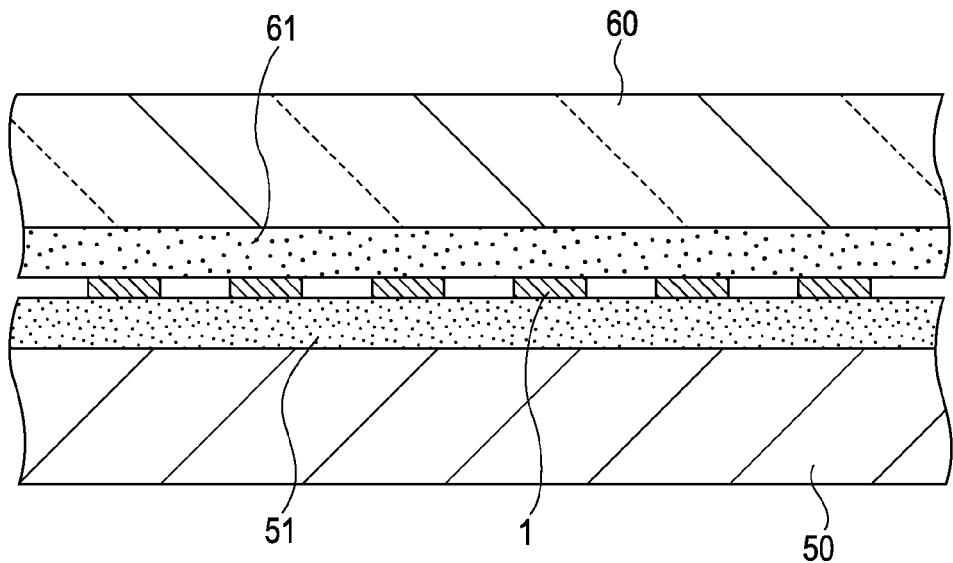

The selected semiconductor light-emitting devices 1 are transferred to the relay substrate 60 such that the exposed first compound semiconductor layer 21 and the exposed first electrodes 41 contact the relay substrate 60. Specifically, the weak adhesive layer 61 is pressed against the semiconductor light-emitting devices 1 arranged on the supporting substrate 50 in a two-dimensional matrix (refer to FIGS. 6A and 6B). Subsequently, for example, an excimer laser is applied to the semiconductor light-emitting devices 1 to be transferred from the back side of the supporting substrate 50 (refer to FIG. 7A). Consequently, laser ablation is caused and the semiconductor light-emitting devices 1 to which the excimer laser has been applied are detached from the supporting substrate 50. When the relay substrate 60 is separated from semiconductor light-emitting devices 1, only the semiconductor light-emitting devices 1 detached from the supporting substrate 50 become attached to the weak adhesive layer 61 (refer to FIG. 7B).

Step-210

Figure 8A:
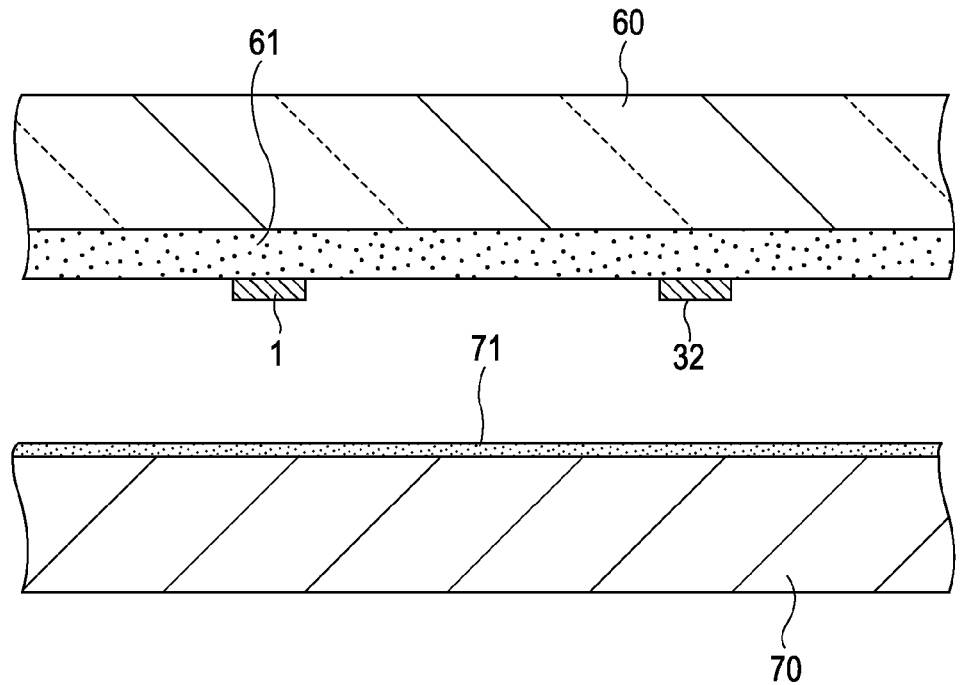
FIGS. 8A and 8B are partial sectional views schematically showing a semiconductor light-emitting device or the like for describing a method for manufacturing the image display apparatus of Example 2 after FIG. 7B.
Figure 8B:
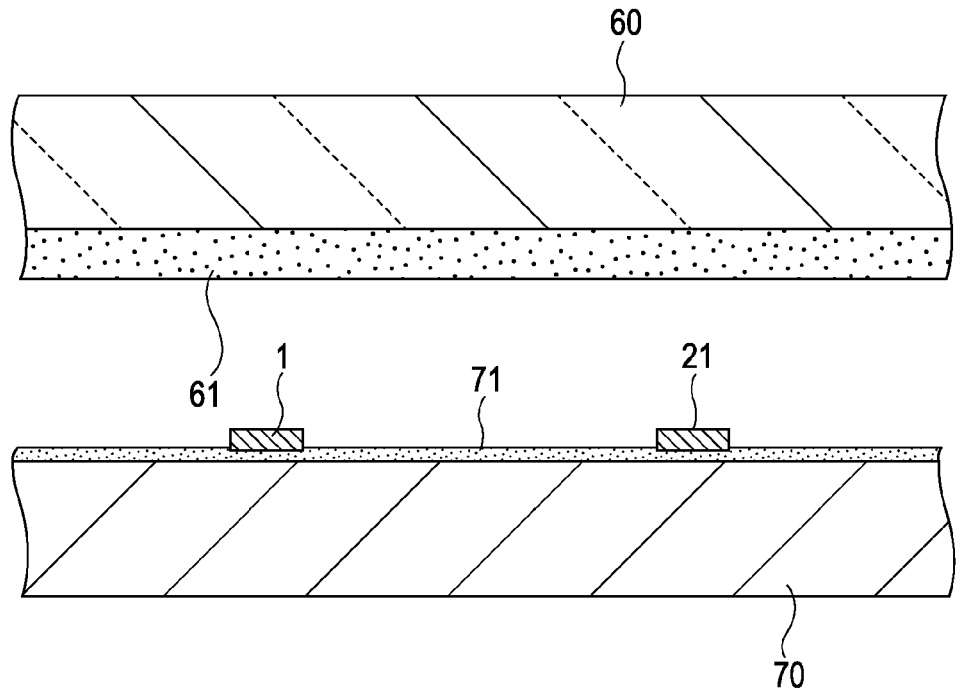

The semiconductor light-emitting devices 1 are placed (moved or transferred) on the adhesive layer 71 (refer to FIGS. 8A and 8B). Specifically, the semiconductor light-emitting devices 1 are placed on the adhesive layer 71 of the second relay substrate 70 from the relay substrate 60 with reference to the alignment mark formed on the second relay substrate 70. Since the semiconductor light-emitting devices 1 are weakly attached to the weak adhesive layer 61, when the relay substrate 60 is moved in the direction in which the relay substrate 60 is detached from the second relay substrate 70 while the semiconductor light-emitting devices 1 are in contact with (are pressed against) the adhesive layer 71, the semiconductor light-emitting devices 1 are left on the adhesive layer 71. Furthermore, by deeply burying the semiconductor light-emitting devices 1 in the adhesive layer 71 using a roller or the like, the semiconductor light-emitting devices 1 can be transferred to the second relay substrate 70.

A method using such a relay substrate 60 is called a step transfer method for the sake of convenience. By repeating the step transfer method a desired number of times, a desired number of semiconductor light-emitting devices 1 are attached to the weak adhesive layer 61 in a two-dimensional matrix and transferred to the second relay substrate 70. Specifically, in Example 2, 160×120 semiconductor light-emitting devices 1 are attached to the weak adhesive layer 61 in a two-dimensional matrix in a single step transfer and then transferred to the second relay substrate 70. Therefore, 1920× 1080 semiconductor light-emitting devices 1 can be transferred to the second relay substrate 70 by repeating the step transfer method (1920×1080)/(160×120)=108 times. In addition, by repeating the above-described steps three times, a desired number of semiconductor red light-emitting devices (red light-emitting diodes), semiconductor green light-emitting devices (green light-emitting diodes), and semiconductor blue light-emitting devices (blue light-emitting diodes) can be transferred to the second relay substrate 70 at a desired distance and pitch.

Subsequently, a photosensitive resin constituting the adhesive layer 71 is cured by applying ultraviolet rays to the adhesive layer 71 on which semiconductor light-emitting devices 1 are arranged. Thus, the semiconductor light-emitting devices 1 are fixed on the adhesive layer 71. After that, the semiconductor light-emitting devices 1 are temporarily fixed on a second substrate for temporal fixing through the first electrodes 41. Specifically, there is prepared a second substrate for temporal fixing composed of a glass substrate on which an adhesive layer 80 composed of an uncured adhesive is formed. By bonding the semiconductor light-emitting devices 1 and the adhesive layer 80 and then curing the adhesive layer 80, the semiconductor light-emitting devices 1 can be temporarily fixed on the second substrate for temporal fixing. Subsequently, the adhesive layer 71 and the second relay substrate 70 are removed from the semiconductor light-emitting devices 1 by an appropriate method. In this state, the second electrode 32 of each of the semiconductor light-emitting devices 1 is exposed.

Step-220

A second insulating layer 81 is entirely formed, and an opening 82 is formed in the second insulating layer 81 above the second electrode 32 of each of the semiconductor light-emitting devices 1. A second wiring line 83 is formed so as to extend from a region on the second electrode 32 to a region on the second insulating layer 81 through the opening 82. The second wiring line 83 extends in a direction perpendicular to the paper surface of the drawing. Subsequently, the second insulating layer 81 including the second wiring line 83 is bonded to a mount substrate 85 composed of a glass substrate through an adhesive layer 84, whereby the semiconductor light-emitting device 1 can be mounted (fixed) on the mount substrate 85. Next, for example, an excimer laser is applied from the back side of the second substrate for temporal fixing. Consequently, laser ablation is caused and the semiconductor light-emitting device 1 to which the excimer laser has been applied is detached from the second substrate for temporal fixing. In this state, the first electrodes 41 of the semiconductor light-emitting device 1 are exposed. Subsequently, a first insulating layer 86 is entirely formed, and an opening 87 is formed in the first insulating layer 86 on the first electrodes 41 of the semiconductor light-emitting device 1. A first wiring line 88 is formed so as to extend from a region on each of the first electrodes 41 to a region on the first insulating layer 86 through the opening 87. The first wiring line 88 extends in a left-right direction of the drawing. FIG. 9 is partial sectional view schematically showing such a structure. By connecting the first wiring line and the second wiring line to respective driving circuits by an appropriate method, a semiconductor light-emitting device and an image display apparatus constituted by the semiconductor light-emitting device can be completed. In the semiconductor light-emitting device 1, light generated in the active layer 23 is emitted in a downward direction of FIG. 9.

The present invention has been described on the basis of preferable Examples, but is not limited to such Examples. The structure and construction of the semiconductor light-emitting device, the material constituting the semiconductor light-emitting device, and the manufacturing conditions and various numerical values of the semiconductor light-emitting device that have been described in Examples are mere examples and can be suitably modified.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor light-emitting device comprising the steps of:
    (a) forming, in sequence, a first compound semiconductor layer having a first conductivity type, an active layer, and a second compound semiconductor layer having a second conductivity type that is different from the first conductivity type on a principal surface of a semiconductor light-emitting device manufacturing substrate;
    (b) forming a transparent conductive material layer on the second compound semiconductor layer;
    (c) forming an insulating layer on the transparent conductive material layer, the insulating layer being composed of a transparent insulating material and having an opening;
    (d) forming a second electrode that reflects light from a light-emitting portion on the transparent conductive material layer exposed at a bottom of the opening and on the insulating layer in a continuous manner;
    (e) bonding the second electrode to a supporting substrate and removing the semiconductor light-emitting device manufacturing substrate; and
    (f) patterning the first compound semiconductor layer, the active layer, the second compound semiconductor layer, and the transparent conductive material layer together with the insulating layer and the second electrode to obtain the light-emitting portion in which the first compound semiconductor layer, the active layer, and the second compound semiconductor layer are laminated in sequence,
    wherein, assuming that an area of the active layer constituting the light-emitting portion is $S_1$, an area of the transparent conductive material layer is $S_2$, an area of the insulating layer is $S_3$, and an area of the second electrode is $S_4$, $S_1 \leq S_2 < S_3$ and $S_2 < S_4$ are satisfied.

2. The method for manufacturing a semiconductor light-emitting device according to claim 1, wherein the transparent conductive material layer transmits 90% or more of light emitted from the light-emitting portion.

3. The method for manufacturing a semiconductor light-emitting device according to claim 2, wherein the transparent conductive material layer is composed of Au, Ni, Pt, ITO, IZO, or $RuO_2$.

4. The method for manufacturing a semiconductor light-emitting device according to claim 1, wherein the insulating layer is composed of silicon oxide, silicon nitride, silicon oxynitride, tantalum oxide, zirconium oxide, aluminum oxide, aluminum nitride, titanium oxide, magnesium oxide, chromium oxide, vanadium oxide, tantalum nitride, or a dielectric multilayer film.

5. The method for manufacturing a semiconductor light-emitting device according to claim 1, wherein the second electrode is composed of silver, a silver alloy, aluminum, or an aluminum alloy.

\* \* \* \* \*